United States Patent [19]

Wakabayashi et al.

[11] Patent Number: 5,477,894
[45] Date of Patent: Dec. 26, 1995

[54] DEVICE FOR CORRECTING LATERAL BENDING OF IC LEADS

[75] Inventors: Takaaki Wakabayashi, Mooka; Tomio Ueno, deceased, late of Mooka, both of Japan, by Hatsue Ueno, legal representative

[73] Assignee: Sanyo Silicon Electronics Co., Ltd., Tochigi, Japan

[21] Appl. No.: 151,811

[22] Filed: Nov. 15, 1993

[30] Foreign Application Priority Data

Nov. 17, 1992 [JP] Japan ..................... 4-331141

[51] Int. Cl.$^6$ ........................... B21F 1/02
[52] U.S. Cl. ........................... 140/147
[58] Field of Search ..................... 140/105, 147

[56] References Cited

U.S. PATENT DOCUMENTS 3,687,172  8/1972  Suverkropp ............... 140/147

FOREIGN PATENT DOCUMENTS 154253   9/1983  Japan .
201450  11/1984  Japan .
01629   3/1987  WIPO .

OTHER PUBLICATIONS

Towa Corporation, TRS Reforming System.

Primary Examiner—Lowell A. Larson
Attorney, Agent, or Firm—Sughrue, Mion, Zinn, Macpeak & Seas

[57] ABSTRACT

A device for correcting the lateral bending of IC leads including a mold having comb-shaped pawls which are inserted into respective gaps between IC leads, wherein each of the comb-shaped pawls of the mold includes a contact member which is contacted with only the end portion of each IC lead, the end portions of the IC leads being pushed and spread out in a lateral direction by the contact members of the pawls when the pawls of the mold are inserted into the gaps. Each of the contact members is designed in a wedge shape.

3 Claims, 6 Drawing Sheets

DEVICE FOR CORRECTING LATERAL BENDING OF IC LEADS

BACKGROUND OF THE INVENTION

1. Field of the Invention

This invention relates to a device for correcting lateral bending of IC leads having narrow-pitch gaps therebetween, such as QFP or SOP, for use in an IC package.

2. Description of the Related Art

There has been generally known a device for correcting the bending of IC leads in a lateral direction (hereinafter referred to as "lateral bending of IC leads") as disclosed in Japanese Laid-open Patent Application No. 58-154253, for example. In this type of device, correcting pawls are obliquely inserted into all gaps between IC leads, and then they are vibrated in a lateral direction to correct the lateral bending of the IC leads.

However, the conventional IC-lead bending correcting device thus constructed has a problem that the IC leads are liable to be intensively damaged because the correcting pawls are vibrated to correct the bending of the leads. In addition, since the correcting pawls are inserted into all the gaps between the IC leads, each of the pawls must be designed to be thinner in thickness when the leads are formed in a fine pitch (corresponding to a narrow pitch below 0.45 mm). This construction of the pawls induces a problem that the pawls have insufficient rigidity and the bending of the IC leads cannot be sufficiently corrected.

Further, in the prior art, the whole positioning of an IC package is carried out by mainly positioning the peripheral portion of the lower side of the IC package. Accordingly, in a case where the package outline dimension (i.e., the dimension of a mold resin) is different from the lead positioning dimension, the correction of the bending of the leads cannot be accurately performed. In addition, if the difference is larger, the IC leads would be further bent.

SUMMARY OF THE INVENTION

An object of this invention is to provide a bending correcting device for accurately correcting the bending of IC leads without damaging the IC leads.

In order to attain the above object, according to this invention, the device for correcting the bending of IC leads in a lateral (horizontal) direction includes a mold equipped with pawls having such a shape as the teeth of a comb (hereinafter referred to as "comb-shaped pawls"), which are inserted into respective gaps between IC leads, and each of the comb-shaped pawls of the mold is provided with a contact member which is contacted with only the end portion of the IC lead to spread out the end portion of the IC lead.

According to this invention, the contact member which is contacted with only the end portion of the IC lead to push and spread out the end portion of the IC lead in the lateral direction is provided to the pawls of the mold, so that the bending of the IC leads can be accurately corrected without damaging the IC leads when the pawls of the mold are inserted into the gaps between the IC leads.

DETAILED DESCRIPTION OF THE PREFERRED EMBODIMENTS

A preferred embodiment according to this invention will be described with reference to the accompanying drawings.

Figure 1:
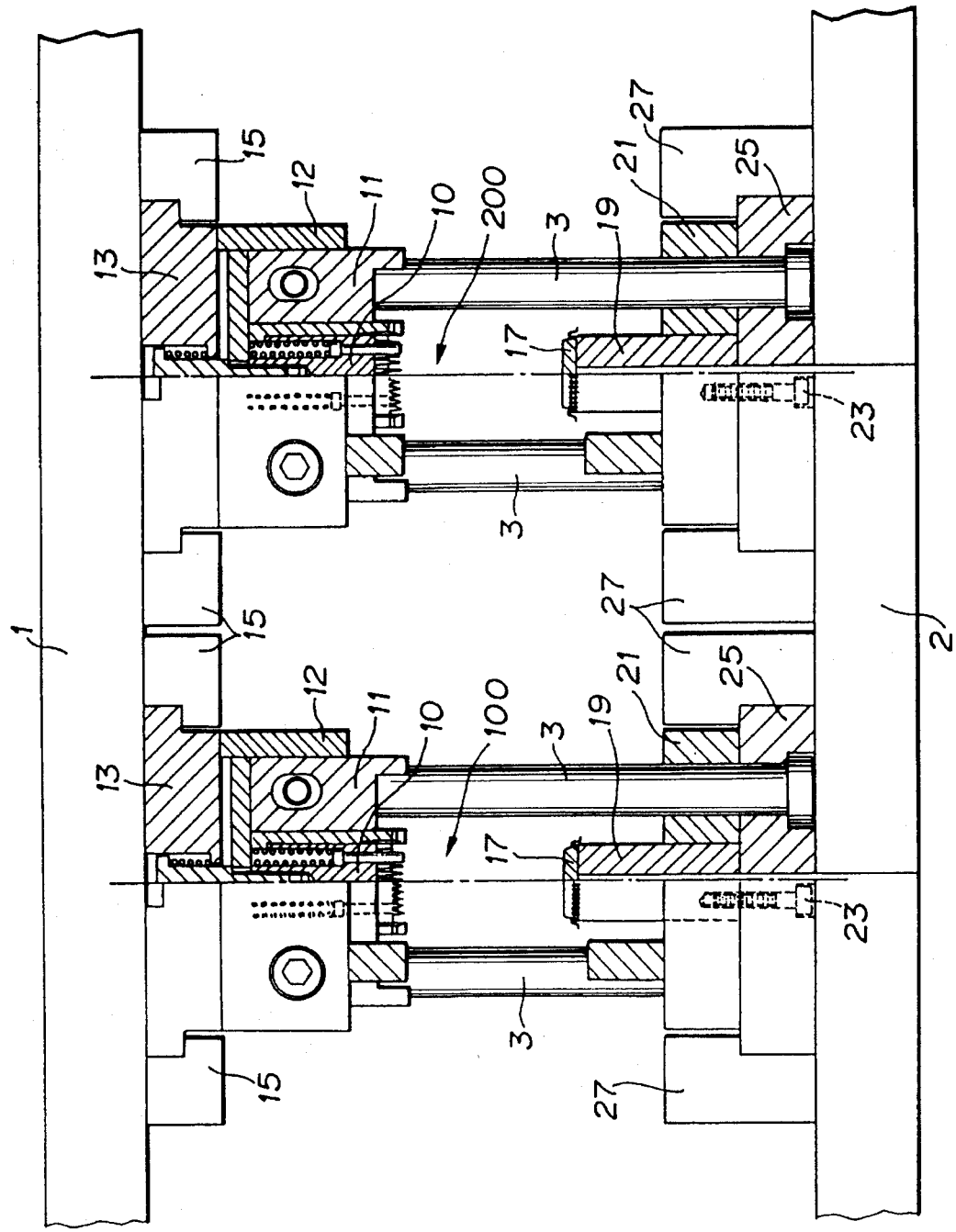
FIG. 1 is a front view showing an embodiment of an IC-lead bending correcting device according to this invention.

FIG. 1 is a front view showing an embodiment of an IC-lead bending correcting device according to this invention. In FIG. 1, a reference numeral 1 represents an upper-mold base, and a reference numeral 2 represents a lower-mold base. As described in detail later, at the lower portion of the upper-mold base 1 are provided two molds of a spread-out mold 100 which is used for a process of pushing and spreading out IC leads, and a push-back mold 200 which is used for a process of pushing back (returning) the IC leads. The molds 100 and 200 are secured to a metal-mold block 10. The metal-mold block 10 is secured to a metal-mold holder 11, and the metal-mold holder 11 is secured to a metal-mold slide holder 12. The metal slide holder 12 is secured to a metal-mold base 13, and the metal-mold base 13 is secured to a guide plate 15 fixed to the upper-mold base 1 so as to be freely drawn out from the guide plate 15.

A die 19 for mounting an IC package 17 thereon is provided at the upper portion of the lower-mold base 2. The die 19 is secured to a die holder 21, and the die holder 21 is secured to a die base 25 through a bolt 23. The die base 25 is secured to a guide plate 27 fixed to the lower-mold base 2 so as to be freely drawn out from the guide plate 27.

Figure 2:
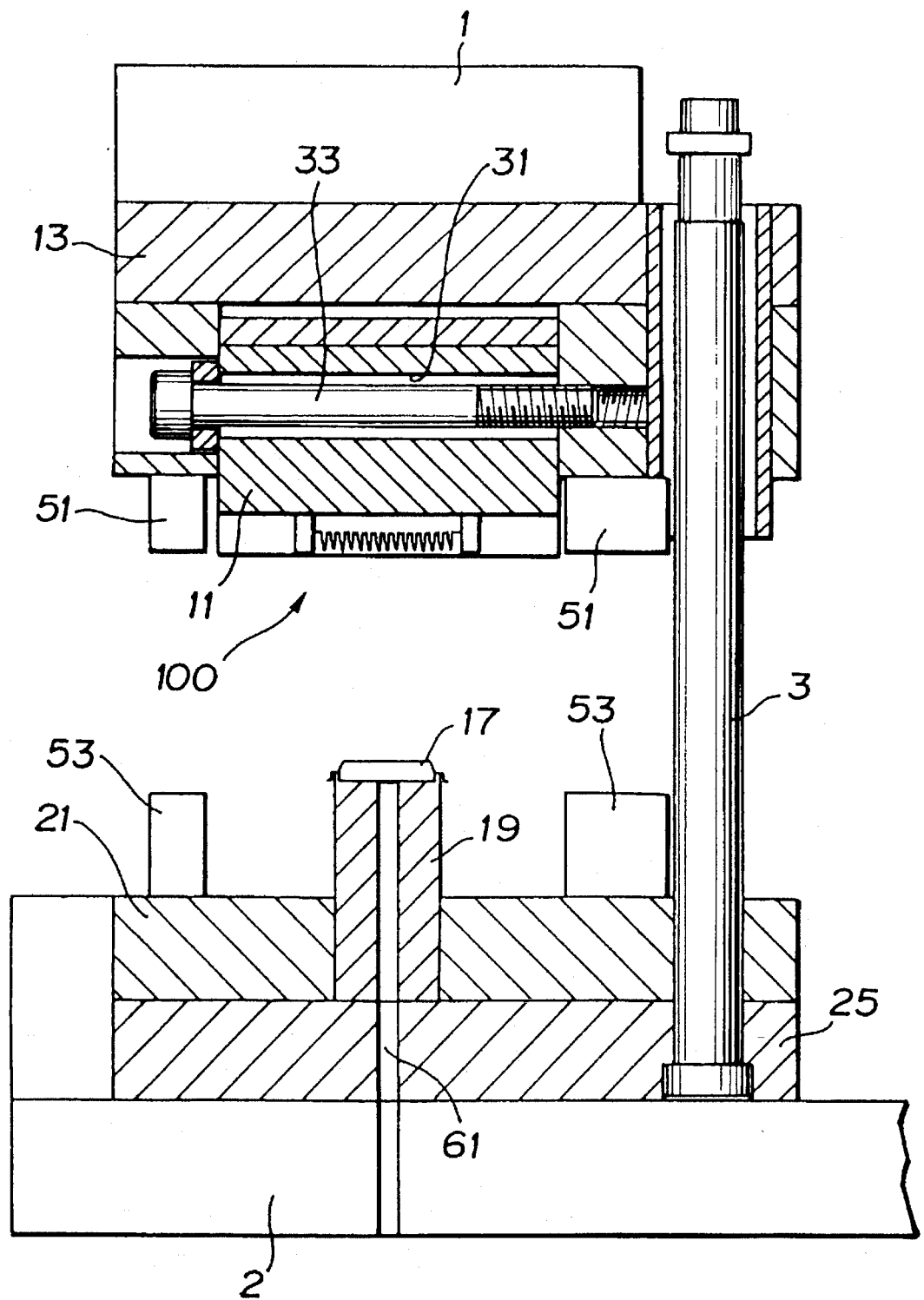
FIG. 2 is a side view of the device as shown in FIG. 1.

As is apparent from FIG. 2, the die 19 at the lower-mold base 2 side is fixedly secured, whereas the metal-mold base 13 at the upper-mold base 1 side is vertically (upwardly and downwardly) movable along a guide post 3. The molds 100 and 200 are designed to be vertically movable through the vertical motion of the metal-mold base 13 along the guide post 3.

Further, an upper stopper 51 is provided at the metal-mold base 13 side while a lower stopper 53 is provided at the die base 25 side. When the molds 100 and 200 are downwardly moved, both of the upper stopper 51 and the lower stopper 53 abuts against each other, and thus these stoppers 51 and 53 serve as a member for determining the bottom dead point of the molds 100 and 200 in combination. With these stoppers 51 and 53, the degree of parallel of the metal-mold base 13, that is, the molds 100 and 200 at the bottom dead point is accurately kept.

A crank mechanism, a cylinder mechanism or the like may be used as a mechanism (not shown) for vertically moving the upper-mold base 1.

Figure 3:
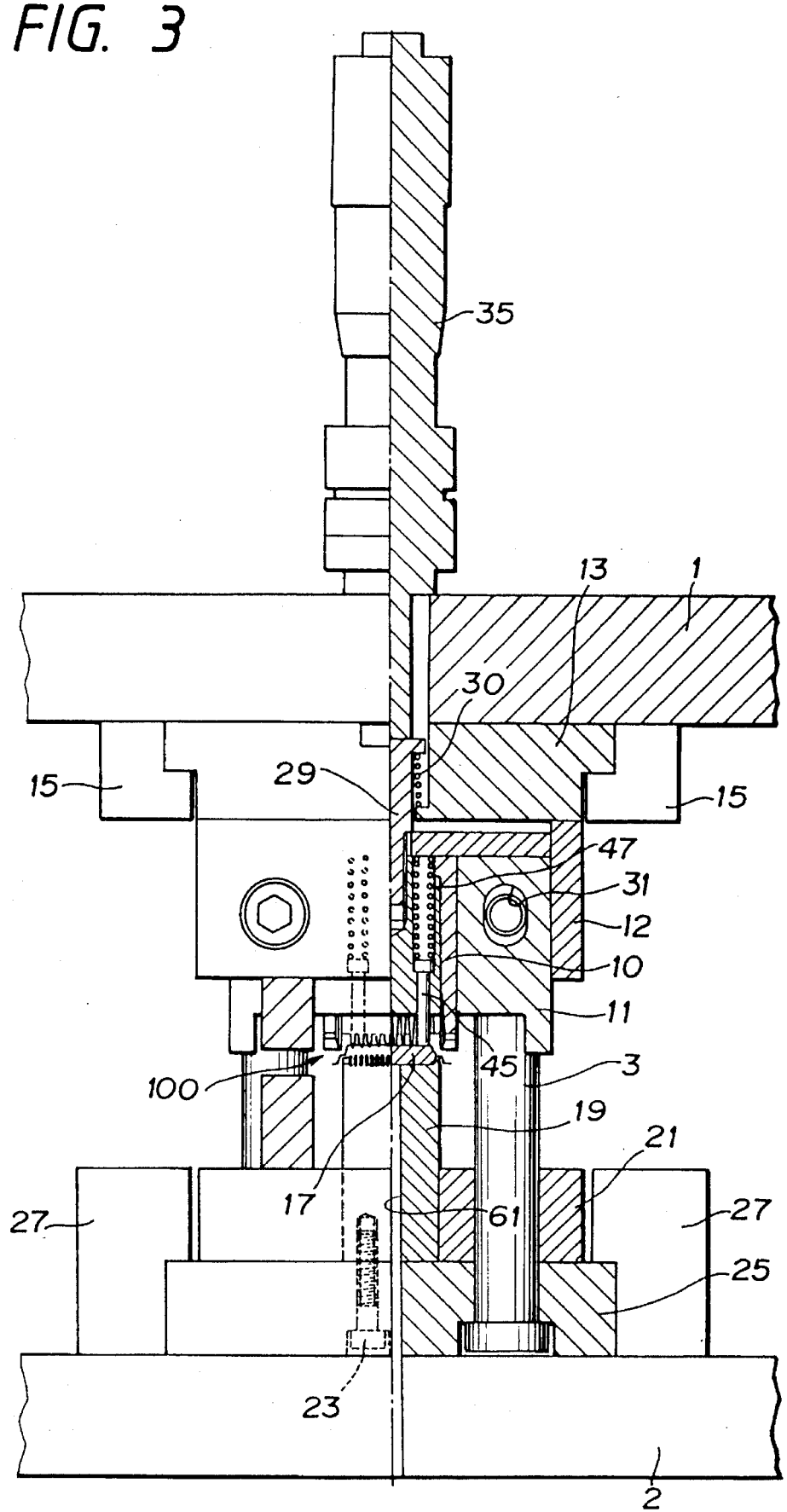
FIG. 3 is a front view showing a state where a mold is downwardly moved.

FIG. 3 shows the metal block 10 to which the mold 100 and the metal holder 11 are suspended at the metal-mold base 13 side by a hanging bolt 29 and a spring 30. The metal-mold holder 11 is formed with an elongated hole 31, and a bolt 33 is penetrated through the elongated hole 31 as shown in FIG. 2. Upon loosening the bolt 33, the metal-mold holder 11 is upwardly or downwardly slid by a distance corresponding to the length of the elongated hole 31. Upon tightening the bolt 33 after positioning the bolt 33, the metal-mold holder 11 is fixed at the position. That is, the position of the mold 100 can be finely adjusted in up and down directions, and the fine adjustment of the mold 100 is carried out using a micro-head 35.

According to this construction, the elements from the metal-mold base 13 to the die base 25 can be integrally handled. That is, these elements are assembled and handled as an assembly unit, and the molds 100 and 200 can be finely adjusted in terms of the assembly unit. For example, when another mold is newly produced, an old mold may be directly exchanged by a beforehand-adjusted mold.

Figure 4:
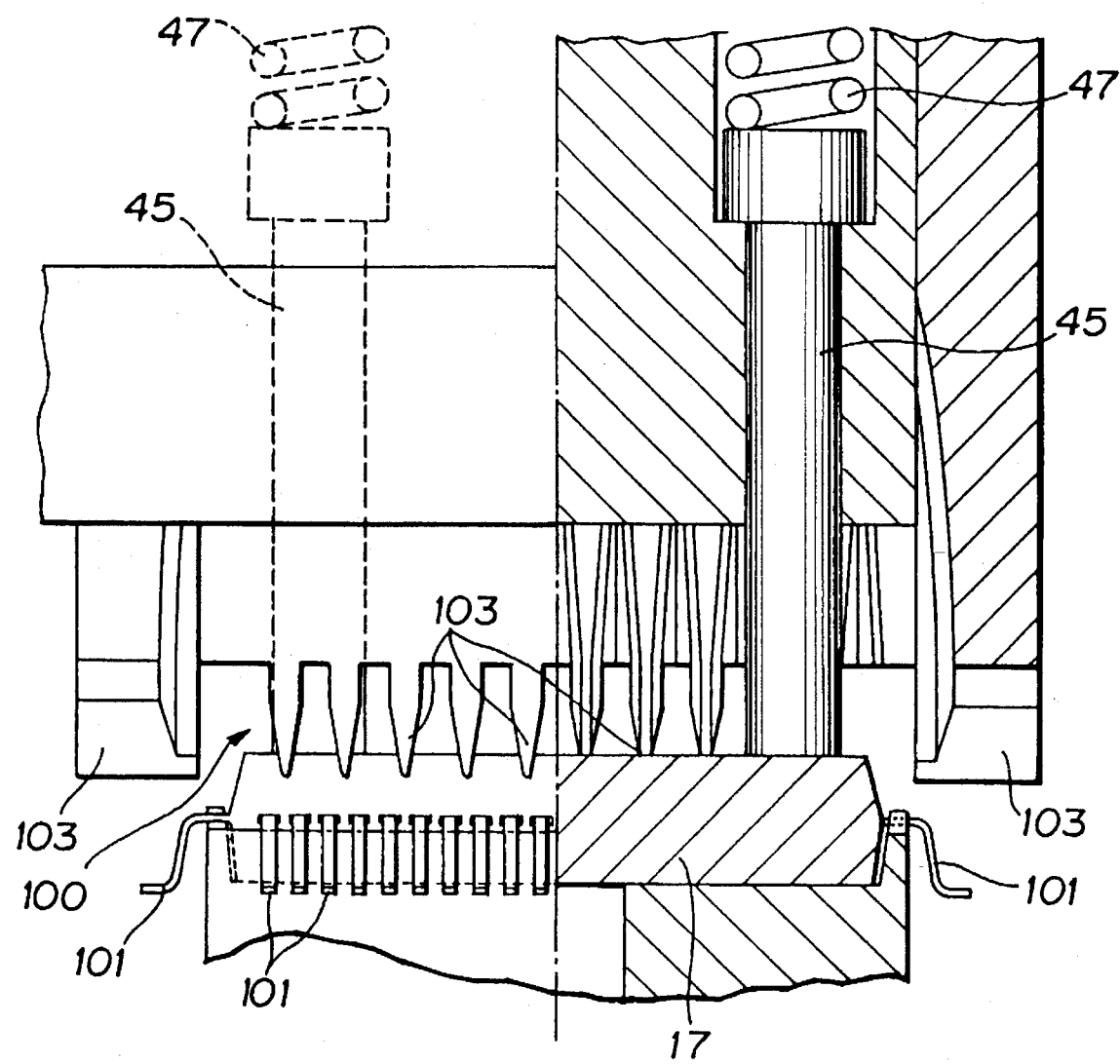
FIG. 4 is an enlarged view of a main part of the device as shown in FIG. 1.

Referring to FIG. 4, the mold 100 is provided with pawls 103 having such a shape as the teeth of a comb, which are inserted into the gaps between leads 101 of an IC package from the upper side to the lower side. These pawls 103 are formed at the four sides of the mold 100 so that they are inserted into the gaps between the leads extending from the four sides of the IC package 17.

According to this embodiment, the pawls 103 are arranged in such a manner that each of the pawls is inserted into every other gap between the leads 101. In this case, if the mold 100 is provided with pawls 103 which are inserted into odd-numbered gaps between the leads 101, the mold 200 are provided with pawls 103 which are inserted into even-numbered gaps between the leads 101.

Figure 5:
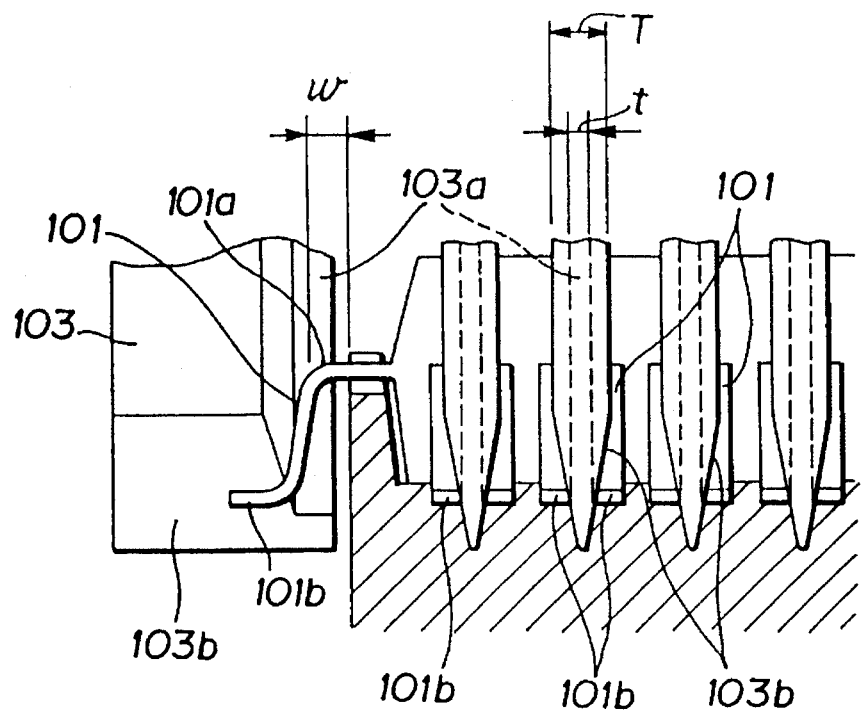
FIG. 5 is a side view showing a process of spreading out IC leads.
Figure 6:
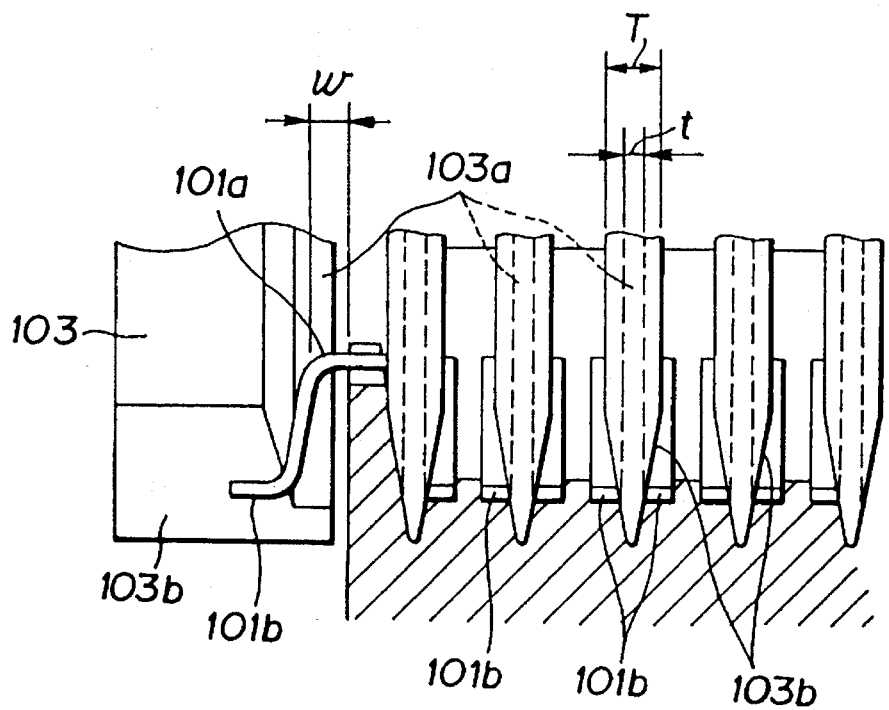
FIG. 6 is a side view showing a process of pushing back the IC leads.

Referring to FIGS. 5 and 6, each of the pawls 103 is provided with a non-contact portion 103a, The thickness t of the non-contact portion 103a is set to a smaller value than the pitch between the leads 101 (hereinafter referred to as "lead pitch") so that the non-contact portion 103a is not contacted with the base 101a of each lead 101 when the pawls 103 are inserted into the gaps between the leads 101. The non-contact portion 103a is formed at only a portion of the pawl 103 which substantially corresponds to the bend width W of the base 101a of the lead 101, and the thickness T of the other portion of the pawl 103 is set to a larger value than the lead pitch.

Referring to FIGS. 5 and 6, each of the pawls 103 is further provided with a wedge-shaped contact portion 103b. The contact portion 103b is designed to be contacted with only the tip portion 101b (flat portion) of the lead 101 when the pawls 103 are inserted into the gaps between the leads 101, so that if the tip portion 101b is bent, the bent tip portion 101b is pushed and spread out by the inserted contact portion 103b to correct the bending of the tip portion 101b of the lead 101.

According to this embodiment, the following device is made when the IC package 17 is fixed to the die 19.

Figure 7A:
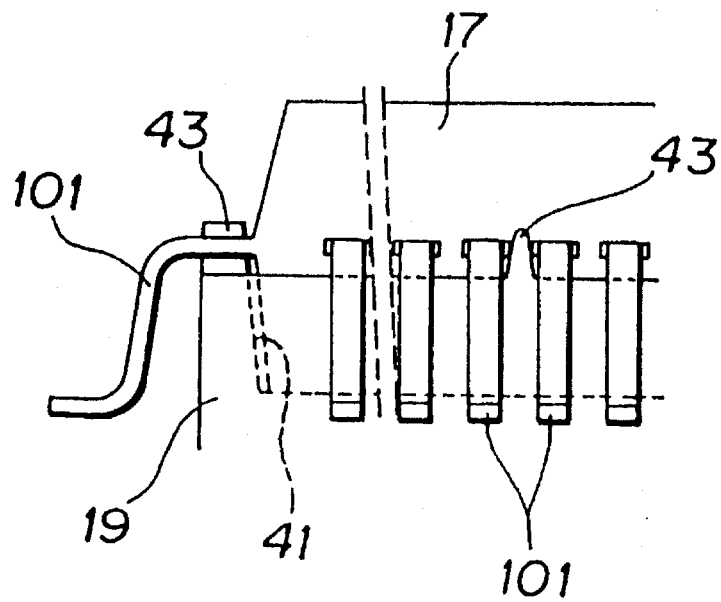
FIGS. 7A and 7B are side views showing positioning states of the IC package.
Figure 7B:
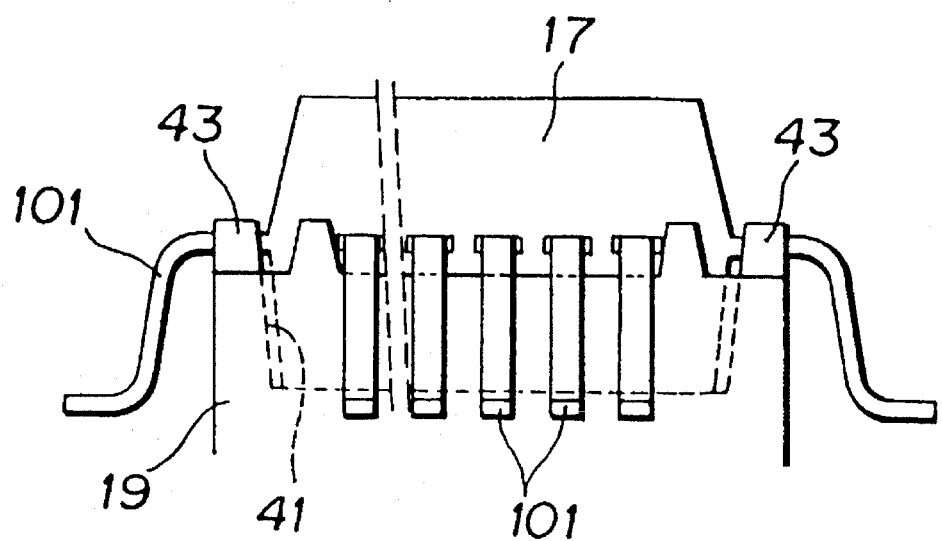

That is, as shown in FIG. 7, a recess portion 41 for mounting the IC package 17 thereon is provided at the upper end surface of the die 19, and the recess portion 41 is designed to be slightly larger in size than the outer size of the IC package 17. Further, four projections 43 are respectively provided at the middle portions of the four sides of the upper edge of the die 19 such that each of the projections 43 is sandwiched between the leads 101. These projections 43 serve to guide the IC package 17 and perform the positioning of the IC package 17 in the recess portion 41. With this construction, even if the IC package disperses in outer size, this dispersion has no obstruction to the mounting of the IC package 17 in the recess portion 41 because this dispersion is solved by clearance between the inner wall of the recess portion 41 and the outer wall of the IC package 17 (i.e., a freely-movable mount state of the IC package 17 in the recess portion 41). In addition, the IC package 17 is guided by the projections 43, and thus the positioning of the IC package 17 on the die 10 can be accurately performed.

For the positioning of the IC package 17 on the die 10, according to this embodiment, pressure pins 45 are further provided to press the upper surface of the IC package 17.

When the mold 100 is downwardly moved, each pressure pin 45 abuts against the upper surface of the IC package 17 before the pawls 103 are inserted into the gaps between the leads 101. Each pressure pin 45 is provided with a spring 47, and when the mold metal 100 is further moved downwardly after the pressure pin 45 abuts against the upper surface of the IC package 17, the pressure pin 45 is pushed up against the urging force of the spring 47, thereby pressing the IC package.

Ordinarily, a pin mark and a print portion are provided on the surface of the IC package 17, and thus the pressure pins 45 are diagonally disposed to avoid these mark and print portion.

For the positioning of the IC package 17, according to this embodiment, a communicating passageway as shown in FIG. 2 is provided such that one end thereof is intercommunicated with the recess portion 41 of the die 19 and the other end is intercommunicated with a sucking device. The IC package 17 which is freely movably inserted into the recess portion 41 is fixedly mounted in the recess portion 41 by the sucking device.

The operation of this embodiment thus constructed will be next described.

In FIG. 1, the IC package 17 is mounted on the die 19 at the spread-out mold 100 side, and then the spread-out mold 100 is downwardly moved. Through this operation, as shown in FIG. 5, the pawls 103 are inserted into every other gaps between the leads, and the tip portions 101b of the leads are pushed and spread out sidewards (in the lateral direction) by the tips 103b of the pawls 103.

Subsequently, the IC package 17 is transferred onto the die 19 of the push-back mold 200 which is located adjacent to the spread-out mold 100 as shown in FIG. 1, and then the pushback mold 200 is downwardly moved. At this time, as shown in FIG. 6, the pawls 103 are inserted into gaps between the spread-out leads (that is, those gaps into which the pawls of the spread-out mold 100 are not inserted), and the tip portions 101b of the IC leads 101 are pushed and spread out sidewards (in the lateral direction) in the same manner as described above. Viewed from another angle, this spread-out operation of the leads corresponds to the push-back (return) operation of the leads. Through this operation, the tip portions 101b of the IC leads 101 are spread out sidewards, and then pushed back in the opposite direction, so that the bending of the IC leads 101 can be accurately corrected without damaging the IC leads.

That is, as shown in FIG. 5, in the first process, the pawls 103 are first inserted into the gaps between the odd-numbered leads 101 from the upper side in the mold 100 to spread out the leads 101 slightly over the normal position thereof using the contact portions 103b of the pawls 103. Subsequently, as shown in FIG. 6, in the second process, the pawls 103 are inserted into the gaps between the even-numbered leads from the upper side in the mold 200 to push back (close) the leads 101 slightly over the normal position thereof using the contact portions 103b of the pawls 103, Therefore. the bending of the leads 101 can be accurately corrected while the leads 101 suffer no damage (scratch or deformation).

This invention is not limited to the embodiment as described above, and various modifications may be made to the above embodiment without departing from the subject matter of this invention.

As described above, the device according to this invention is provided with the mold having the comb-shaped pawls which are inserted into the gaps between the IC leads, and each pawl is provided with a contact portion which is contacted with only the tip portion of each IC lead to spread out the tip portion of the lead, so that the bending of the IC leads can be accurately corrected without damaging the IC leads.

What is claimed is:

1. A device for correcting the bending of IC leads of an integrated circuit package in a lateral direction, said leads having a base portion fixed to said integrated circuit package and an end portion, including:

a spread-out mold having comb-shaped pawls which are inserted into odd(even)-numbered gaps between IC leads, wherein each of said comb-shaped pawls of said mold includes a contact member which is contacted with only the end portion of each of said IC leads, and a non-contact member which is formed at a portion of said pawl corresponding to the base portion of each of said IC leads such that said non-contact member is not contacted with the base portion, the end portions of said IC leads being pushed and spread out in a lateral direction by said contact members of said pawls when said pawls of said spread-out mold are inserted into the odd(even)-numbered gaps; and a push-back mold having comb-shaped pawls which are inserted into even(odd)-numbered gaps between said IC leads, wherein each of said comb-shaped pawls of said mold includes a contact member which is contacted with only the end portion of each of said IC leads, and a non-contact member which is formed at a portion of said pawl corresponding to the base portion of each of said IC leads such that said non-contact member is not contacted with the base portion, the end portions of said IC leads which have been bent in the lateral direction by said spread-out mold being pushed back in the opposite direction to the lateral direction by said contact members of said pawls when said pawls of said push-back mold are inserted into the even(odd)-numbered gaps between said IC leads.

2. A device for correcting the bending of IC leads of an integrated circuit package in a lateral direction, said leads having a base portion fixed to said integrated circuit package and an end portion, including:

a mold having comb-shaped pawls which are inserted into respective gaps between IC leads, wherein each of said comb-shaped pawls of said mold includes a contact member which is contacted with only said end portion of each of said IC leads, said end portions of said IC leads being pushed and spread out in a lateral direction by said contact members of said pawls when said pawls of said mold are inserted into said gaps, and a non-contact member formed at a portion of said pawl corresponding to said base portion of each of said IC leads such that said non-contact member does not contact said base portion, wherein said non-contact member has a thickness less than the pitch of said base portions of said IC leads and said contact member has a thickness larger than the pitch of said end portions of said IC leads.

3. The device as claimed in claim 2 wherein said pawls are arranged so as to be inserted into every other gap between said IC leads.

* * * * *